US006747296B1

(12) United States Patent
Clark

(10) Patent No.: US 6,747,296 B1
(45) Date of Patent: Jun. 8, 2004

(54) AVALANCHE PHOTODIODE MULTIPLICATION REGION AND AVALANCHE PHOTODIODE WITH LOW IMPACT IONIZATION RATE RATIO

(75) Inventor: William Clark, Chelmsford, MA (US)

(73) Assignee: Solid State Scientific Corporation, Hollis, NH (US)

( * ) Notice: Subject to any disclaimer, the term of this patent is extended or adjusted under 35 U.S.C. 154(b) by 0 days.

(21) Appl. No.: 10/464,693

(22) Filed: Jun. 18, 2003

Related U.S. Application Data
(60) Provisional application No. 60/389,877, filed on Jun. 18, 2002.

(51) Int. Cl.[7] .............................................. H01L 31/072
(52) U.S. Cl. ........................ 257/186; 257/189; 257/438
(58) Field of Search ............................ 257/15, 21, 186, 257/189, 438

(56) References Cited

U.S. PATENT DOCUMENTS 6,437,362 B2 * 8/2002 Suzuki ........................ 257/21

2003/0047752 A1 * 3/2003 Campbell et al. ........... 257/186

* cited by examiner

Primary Examiner—Minh-Loan Tran
(74) Attorney, Agent, or Firm—Louis J. Franco

(57) ABSTRACT

An avalanche photodiode charge-carrier multiplication region comprises a first region fabricated from a first material having a first impact ionization threshold and a second region joined to the first region at an interface and fabricated from a second material having a second impact ionization threshold lower than the first impact ionization threshold. The first region includes, in the presence of an applied reverse-bias, first and second oppositely charged layers to establish an elevated, localized electric field within a sub-region of the first region. The first and second charged layers are arranged such that preferred charge carriers are accelerated by the localized electric field just prior to being injected into the second material where they impact ionize at predetermined statistical rate. Conversely, non-preferred charge carriers are accelerated by the localized electric field into the first material where, due to the higher impact ionization threshold of the first material, the non-preferred charge carriers impact ionize at a statistical rate lower than the statistical rate at which preferred charge carriers impact ionize in the second material.

30 Claims, 6 Drawing Sheets

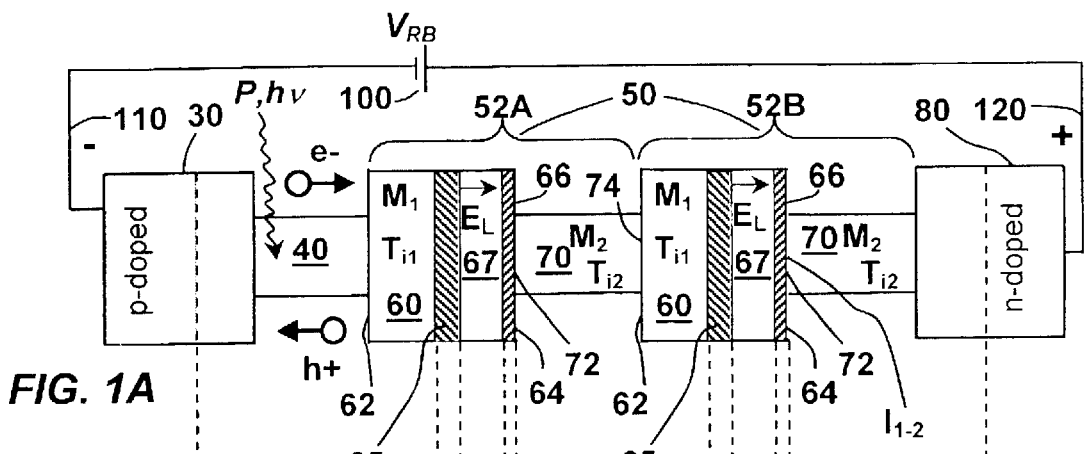
*FIG. 1A*
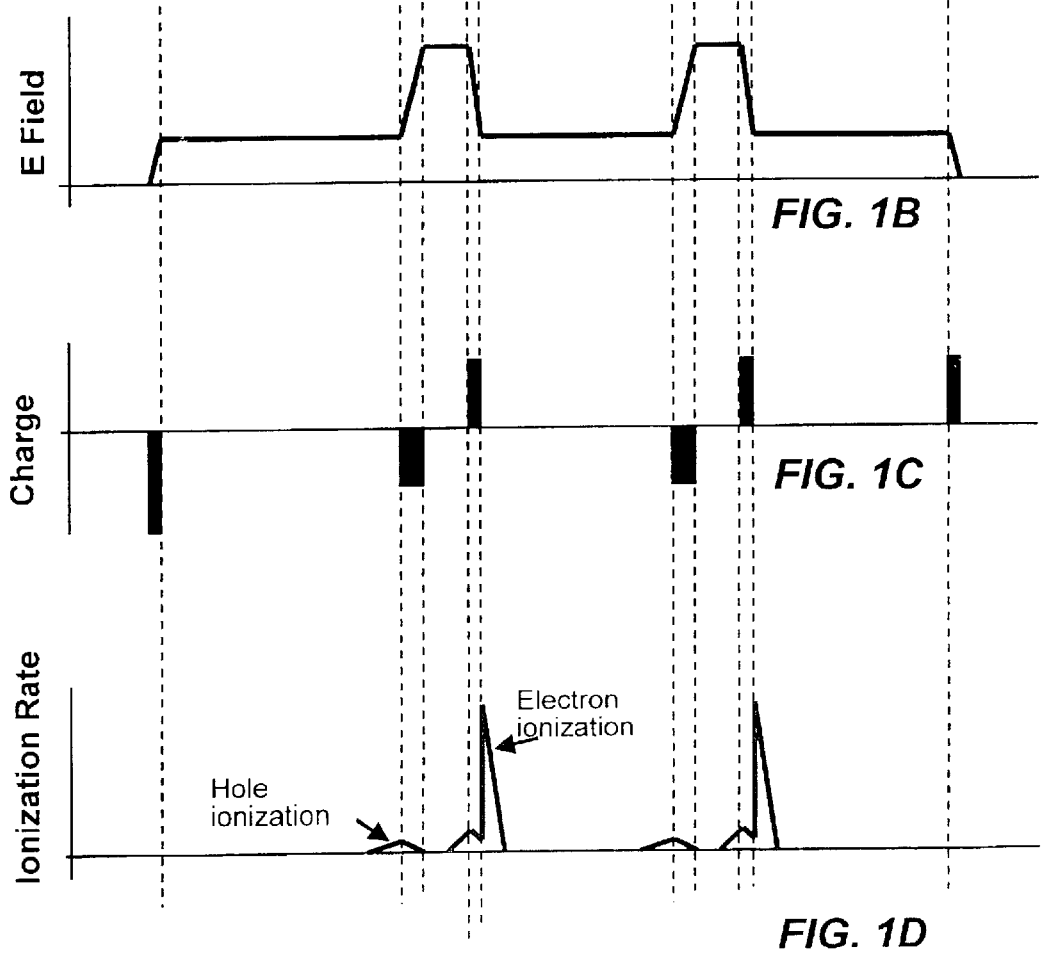
*FIG. 1B*
*FIG. 1C*
*FIG. 1D*

Diagram illustrating a total gain of 5 (i.e. 1 electron in, 5 out) with electrons accounting for 3 impact ionizations and holes accounting for only one).

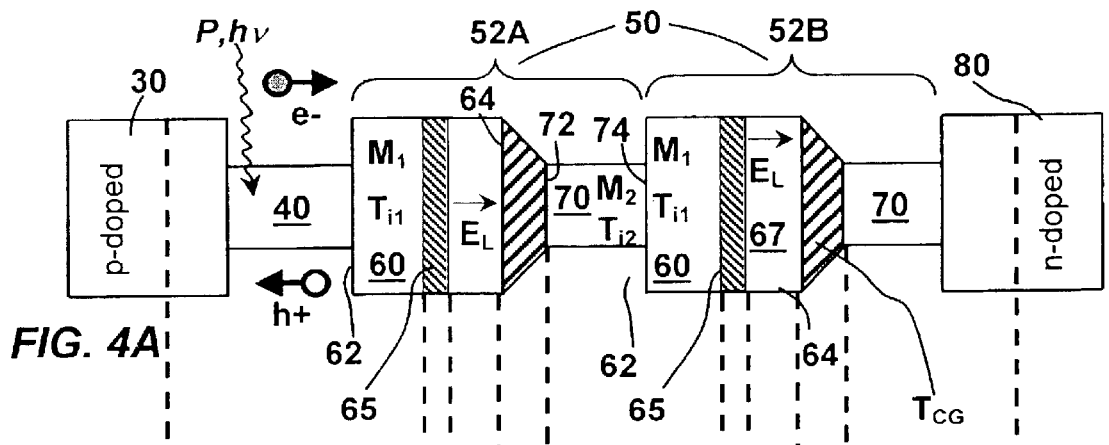
FIG. 4A
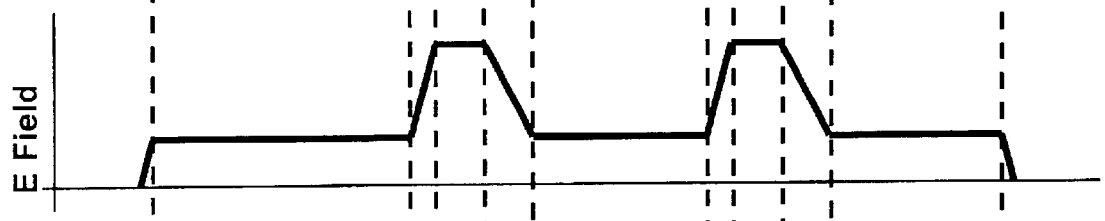
FIG. 4B
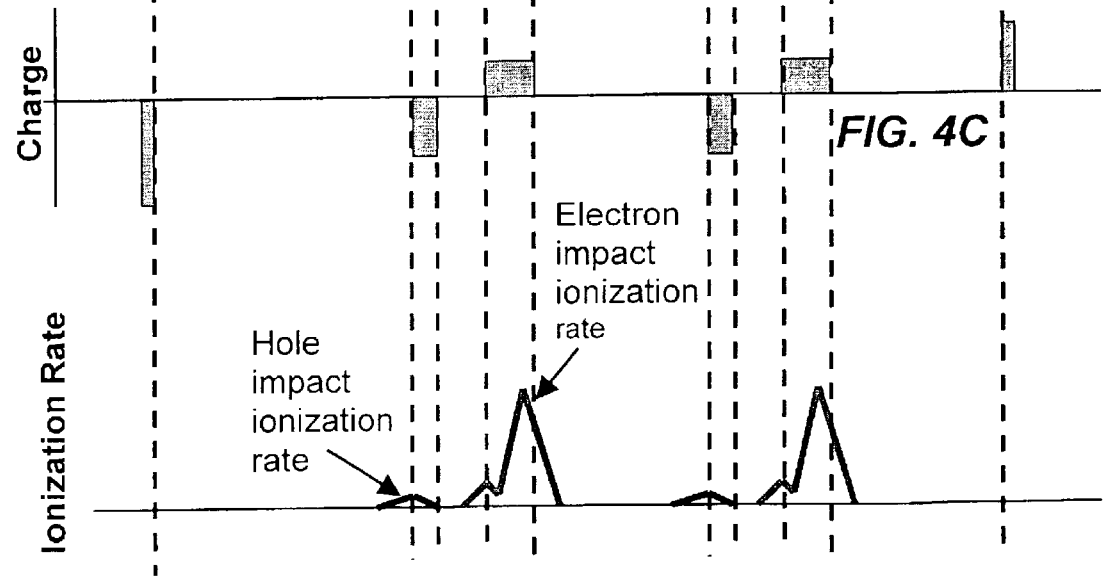
FIG. 4C
FIG. 4D

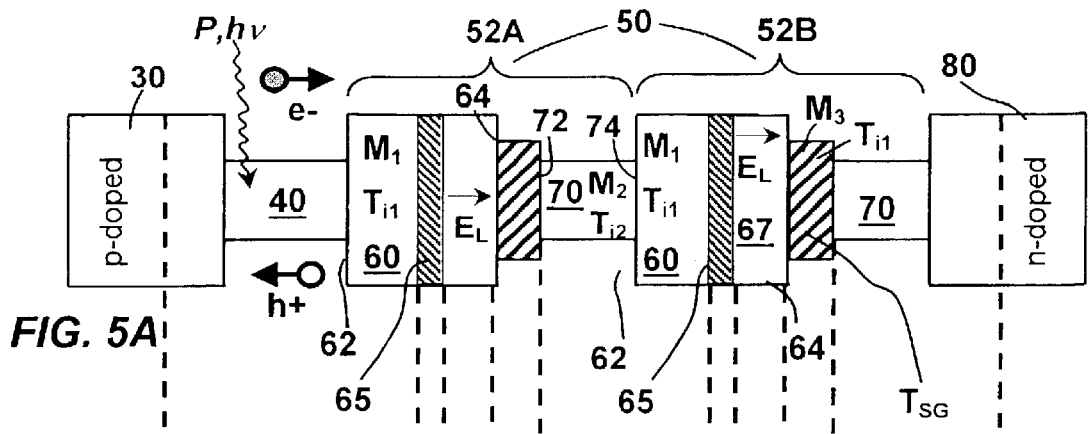
FIG. 5A
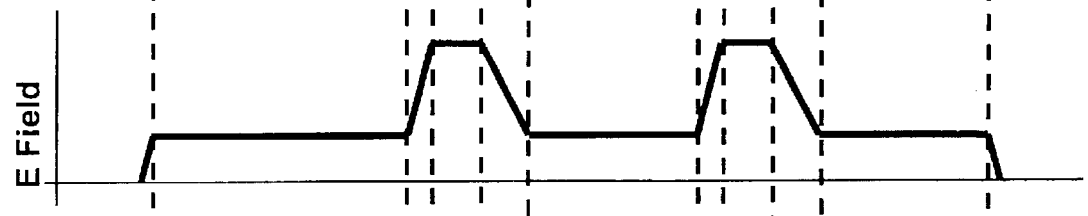
FIG. 5B
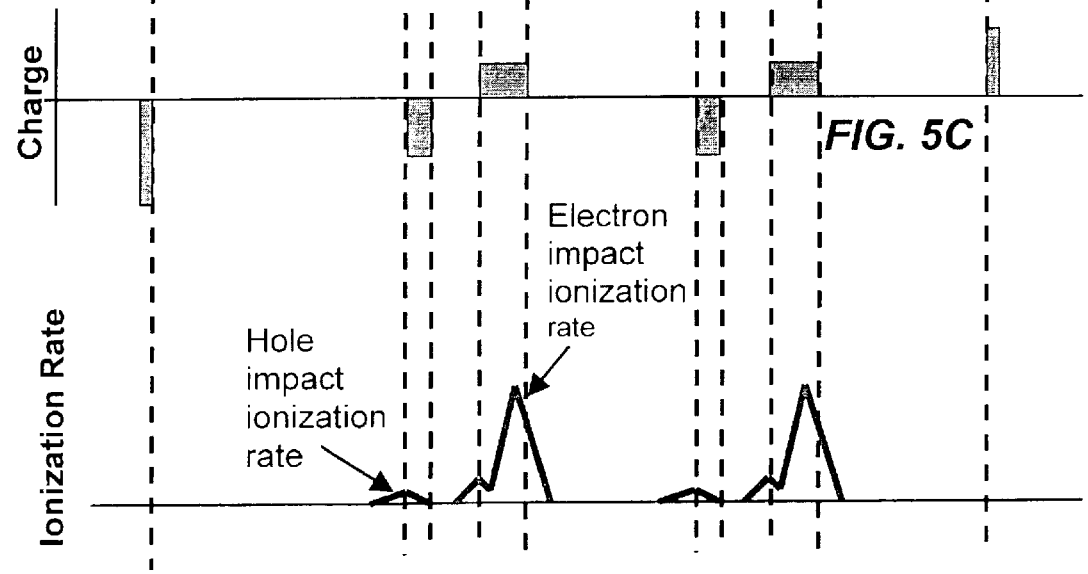
FIG. 5C
FIG. 5D

AVALANCHE PHOTODIODE MULTIPLICATION REGION AND AVALANCHE PHOTODIODE WITH LOW IMPACT IONIZATION RATE RATIO

PROVISIONAL PRIORITY CLAIM

Priority based on Provisional Application, Serial No. 60/389,877, filed Jun. 18, 2002, and entitled "AVALANCHE PHOTODIODE WITH VERY LOW IMPACT IONIZATION RATE RATIO" is claimed.

BACKGROUND

1. Field

Implementations of the present invention relate generally to the field of photodiodes and more particularly to an avalanche photodiode (i.e., APD) with a reduced excess noise factor and an increased gain-bandwidth product.

2. Brief Description of an Illustrative Environment and Related Art

Avalanche photodiodes are incorporated in many high performance optical communications, imaging and sensing applications because they enable high signal to noise ratio and high-speed operation. An optical receiver including an APD has a signal to noise ratio that is a function of several parameters including the APD's excess noise factor. The excess noise factor, in turn, depends on the ratio of electron and hole ionization rates in the multiplication region of the APD. The ratio of the rates at which electrons and holes impact ionize in the multiplication region is expressed in terms of the rate of impact ionization by "undesirable" carriers over the rate of impact ionization by "desirable" carriers. For instance, if a particular APD is designed such that electrons are the charge carriers of choice, which is typical, then the impact ionization rate ratio is expressed in terms of the impact ionization rate of holes (undesirable) over the impact ionization rate of electrons (desirable). Conversely, in an APD in which holes are the carriers of choice, the impact ionization rate ratio is expressed in terms of the impact ionization rate of electrons (undesirable) over the impact ionization rate of holes (desirable). A high signal to noise ratio typically requires a low ionization rate ratio. The gain-bandwidth product also improves as the ionization rate ratio is reduced. In short, the optimization of the performance of an avalanche photodiode is largely focused on devising materials and device architecture that, when subjected to a predetermined reverse-bias voltage, result in impact ionization by a substantially greater quantity of desired carriers in one direction than undesired carriers in the opposite direction.

A typical ionization rate ratio exhibited by a silicon APD is about 0.02. However, silicon is not well suited for optical detection of wavelengths outside the range of about 0.35 to 1.0 microns. Accordingly, outside this range, other materials are typically used for detection. Alternative materials, however, are of limited utility due to less desirable impact ionization characteristics. For instance, InGaAs/InP heterojunction APDs absorb well in the range of 1.0 to 1.65 microns, but are of limited utility because the impact ionization rate ratio is about 0.4.

Accordingly, a need exists for an avalanche photodiode with an impact ionization rate ratio better than that exhibited by other-than-silicon APDs (e.g., InGaAs/InP) and an optical sensitivity over a wavelength range exceeding that attainable with silicon APDs.

SUMMARY

In various implementations, an avalanche photodiode structure includes a substrate, an optical absorption region and a charge-carrier multiplication region. The optical absorption region and the multiplication region are situated between a p-doped region (i.e., the anode of the APD) and an n-doped region (i.e., the cathode of the APD) that are, in order to introduce a reverse bias, placed in electrically conductive engagement with, respectively, the cathode and anode of an external energy source.

The charge-carrier multiplication region is adapted to facilitate (a) the generation, through impact ionization, of charge-carrier pairs in which each charge-carrier pair includes first and second oppositely charged charge carrier types (e.g., a negatively charged electron and a positively charged hole), and (b) the movement of charge carriers of the first type in a first direction and of charge carriers of the second type in a second direction anti-parallel to the first direction. Impact ionization by one of the first and second charge carrier types is preferred over impact ionization of the opposite charge carrier type. Typically, the preferred charge carrier type (i.e., for impact ionization) is an electron, but devices in which holes are preferred carriers are within the scope and contemplation of the invention.

Typically embodied, the charge-carrier multiplication region comprises at least one period of lattice structure comprising a first crystalline region having first and second sides and a second crystalline region having first and second ends and joined, at its first end, to the second side of the first crystalline region at a first region-second region interface. The first crystalline region is fabricated from a first material having a first impact ionization threshold and the second crystalline region is fabricated from a second material having a second impact ionization threshold. The second impact ionization threshold is lower than the first impact ionization threshold thereby rendering the second material a higher impact ionization rate material than the first material. In various embodiments, it is desirable for the interface to be as "abrupt" as possible. That is, in such embodiments, it is desirable to achieve as clear a delineation as practicable during fabrication between the materials of the first and second regions.

Alternative embodiments include a "transition" between the first and second regions of a period that is intentionally "step-graded" or "continuously graded" resulting in more gradual charge-carrier movement between the first and second materials. The differences between an idealized abrupt interface, a step-graded transition and a continuously graded transition may be conceptualized in terms of a selected manner of descent from a higher floor to a lower floor in a building. Crossing an ideal "interface" is analogous to freefalling to the lower floor through an elevator shaft; moving through a step-graded transition is analogous to descending a staircase and moving through a continuously graded transition is akin to descending a slide. In various embodiments, a continuously graded transition is a region exhibiting a continuous grade in energy gap and ionization threshold. A step-graded transition is a region of at least one discrete sub-region exhibiting a gap energy and ionization threshold between those of the first and second materials of the first and second regions.

A representative, non-exhaustive list of materials suitable, in various implementations, for use as the first material includes InAlAs, AlGaAs, InP, InAlGaAs, and InGaAsP. An analogous list of materials suitable for use as the second material includes InGaAs, InAlGaAs, GaAs, InGaAsP, and Si.

In various embodiments, the first and second materials are intrinsic except that the first crystalline region includes first and second oppositely doped layers separated by an intrinsic sub-region of the first crystalline region. These oppositely charged layers create a localized electric field in the sub-region between the first and second oppositely doped layers. Moreover, the magnitude of the localized electric field is elevated with respect to the "background" electric field resulting from the reverse-bias potential difference applied across the various regions of the APD from an external energy source.

Persons of ordinary skill in the art understand the term "intrinsic" to include "unintentionally doped." That is, because it is extremely difficult to obtain completely "pure" crystal outside of regions that are intentionally doped, practitioners of the relevant art understand that, in various applications, "intrinsic" implies "as un-doped as practicable" under the design and fabrication circumstances. Accordingly, the term "intrinsic" as used throughout the specification and claims should not be construed so narrowly as to be limited to the nearly unattainable condition of pure, totally un-doped crystal and, in any event, should be construed at least broadly enough to include "unintentionally doped."

The first and second oppositely doped layers are arranged such that each charge carrier of a set of charge carriers of the preferred type having a travel path directed toward the second end of the second crystalline region, and extending through the first region-second region interface, encounters a doped layer of the same charge prior to encountering the doped layer of the opposite charge. Accordingly, the preferred charge type is accelerated toward the second region by the localized electric field prior to passing through the first region-second region interface and entering the second region where, due to the lower impact ionization threshold of the second crystalline material, and the increased kinetic energy of the accelerated preferred charge carrier, the preferred charge carrier has a predetermined statistical probability of dissipating energy through impact ionization and generating additional pairs of first and second oppositely charged charge carrier types at a predetermined statistical rate. Conversely, although each charge carrier of a set of charge carriers of the non-preferred type that has a travel path directed across the interface toward the first end of the first region, and extending at least partially through each of the first and second crystalline materials, is accelerated by the localized electric field, that non-preferred charge carrier has a lower statistical probability of dissipating energy through impact ionization within the first material at as high a statistical rate as a charge carrier of the preferred type in the second material due to the higher impact ionization threshold of the first material.

In various embodiments including more than one period within the multiplication region, the periods are joined at periodic interfaces that are fabricated as abruptly as practicable. Alternative embodiments, however, include a "hole step-down region" comprising, for example, at least one discrete layer of a third material with an energy gap greater than that of the second material and lower than that of the first material and a third impact ionization threshold greater than that of the second impact ionization threshold and lower than that of the first impact ionization threshold. The purpose of such a hole step-down region is twofold: first, the layer "breaks up" the energy step encountered by holes traveling from the first region of one period into the second region of a neighboring period, thereby decreasing the probability of hole-initiated impact ionization and, second, electrons traveling from the second region of one period into the first region of a neighboring period are provided with an intermediate energy step that facilitates the "climb" and enhances the overall speed of the device.

Representative embodiments are more completely described in the following detailed description, the elucidation of which is facilitated by the schematic representations of, and numerical and graphical data relating to, an illustrative embodiment contained in the accompanying drawings.

BRIEF DESCRIPTION OF THE DRAWINGS

FIG. 1A schematically depicts various regions of an illustrative APD embodying aspects of the invention;

FIG. 1B indicates the electric profile of the APD in FIG. 1A;

FIG. 1C indicates the charge present in each of region of a selected set of regions within the APD of FIG. 1A as a result of doping and an applied reverse bias voltage;

FIG. 1D is a graphical representation of impact ionization rate of each of electrons and holes in each of the two periods of the illustrative multiplication region in FIG. 1A as a function of position within the multiplication region;

FIG. 4A depicts an embodiment including a continuously graded transition between the first and second regions of each of the first and second periods of an illustrative two-period multiplication region;

FIG. 4B indicates the electric profile of the APD in FIG. 4A;

FIG. 4C indicates the charge present in each of region of a selected set of regions within the APD of FIG. 4A as a result of doping and an applied reverse bias voltage;

FIG. 4D is a graphical representation of impact ionization rate of each of electrons and holes in each of the two periods of the illustrative multiplication region in FIG. 4A as a function of position within the multiplication region;

FIG. 5A depicts an embodiment including a step-graded transition between the first and second regions of each of the first and second periods of an illustrative two-period multiplication region;

FIG. 5B indicates the electric profile of the APD in FIG. 5A;

FIG. 5C indicates the charge present in each of region of a selected set of regions within the APD of FIG. 5A as a result of doping and an applied reverse bias voltage;

FIG. 5D is a graphical representation of impact ionization rate of each of electrons and holes in each of the two periods of the illustrative multiplication region in FIG. 5A as a function of position within the multiplication region;

DETAILED DESCRIPTION

Figure 2:
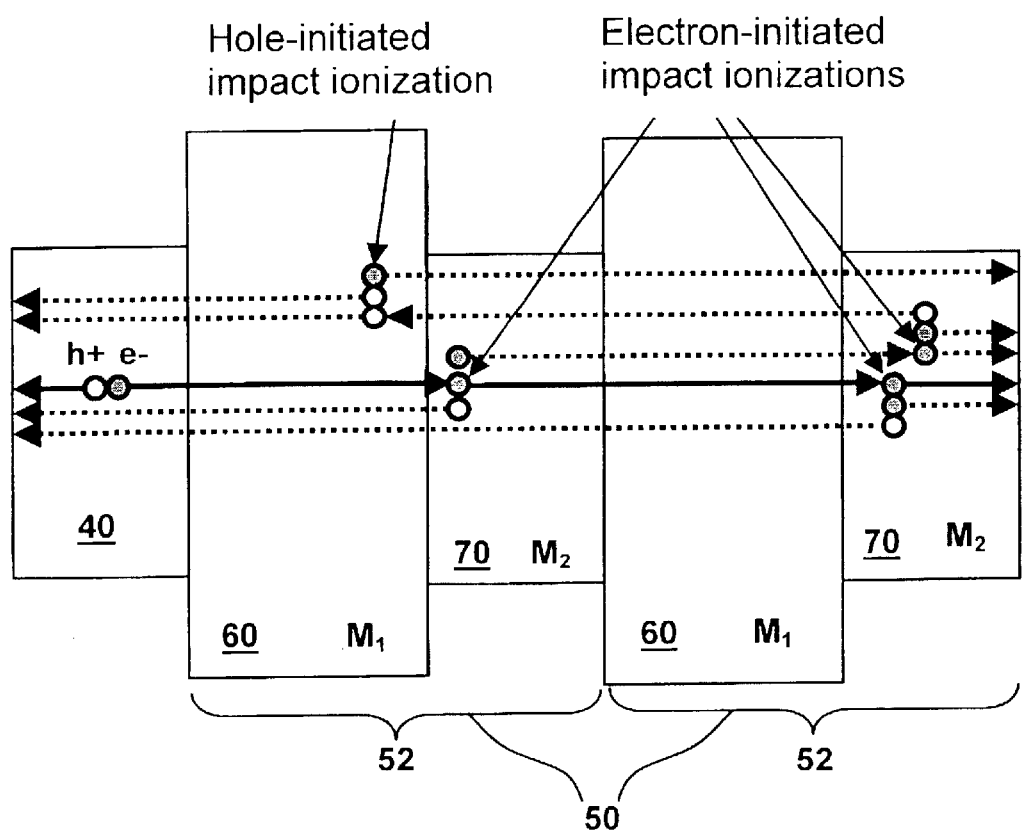
FIG. 2 is a qualitative illustration of a scheme by which preferred carriers are caused to impact ionize at a higher rate than non-preferred carriers.

The following description of an avalanche photodiode (APD) having a multiplication region contributing to a low impact ionization rate ratio is illustrative in nature and is therefore not intended to limit the scope of the invention or its application of uses. The examples depicted and discussed, unless otherwise noted, are ones in which impact ionization by electrons is preferred over impact ionization by holes. That is, electrons are the preferred carriers.

Referring to FIG. 1A, the structure of an illustrative APD 10 is schematically represented and includes a p-doped anode 30, an optical absorption region 40, a charge-carrier multiplication region 50 and an n-doped cathode 80. A reverse bias voltage $V_{RB}$ is applied across the APD 10 by placing in electrically conductive engagement the p-doped anode 30 of the APD 10 and the positive-charge-attracting cathode 110 of an external energy source 100 and the n-doped cathode 80 of the APD 10 with the negative-charge-attracting anode 120 of the external energy source 100. The illustrative charge-carrier multiplication region 50 includes two periods 52A and 52B of layered lattice structure. Each of periods 52A and 52B comprises a first region 60 fabricated from a first material $M_1$ having a first impact ionization threshold $T_{i1}$ and a second region 70 fabricated from a second material $M_2$ having a second impact ionization threshold $T_{i2}$, wherein the second impact ionization threshold $T_{i2}$ is lower than the first impact ionization threshold $T_{i1}$. Stated alternatively, there is a greater energy band gap between the valence and conduction bands in the first material $M_1$ than in the second material $M_2$ such that an electric field E of greater magnitude is required in order to initiate impact ionization in the first material $M_1$ than in the second material $M_2$. Therefore, the second material $M_2$ is regarded as a "high ionization rate" material relative to the first material $M_1$. The first region 60 has opposite first and second sides 62 and 64 and the second region has opposite first and second ends 72 and 74. The second side 64 of the first region 60 is joined to the first end 72 of the second region 70 at a first region-second region interface $I_{1-2}$.

As shown in FIG. 1A, with the APD 10 reversed biased, a photon P enters the optical absorption region 40. The energy hv of the incident photon P is absorbed in generating a charge carrier pair including first and second oppositely charged charge carrier types; namely, a primary electron $e_p-$ and a primary hole $h_p+$. These charges are regarded as "primary" because they are directly generated in the absorption region 40 by the absorption of photon energy hv. In the presence of the electric field E created by the applied reverse bias voltage $V_{RB}$, the primary hole $h_p+$ is drawn toward the APD anode 30, where it is collected, while the primary electron $e_p-$ is drawn toward the multiplication region 50 by the positive charge at the APD cathode 80 and the anode 120 of the external energy source 100.

The primary electron $e_p-$ enters the multiplication region 50 through the first material $M_1$ of the first period 52A. As previously stated, the first material $M_1$ is characterized by a first impact ionization threshold $T_{i1}$ which, by design in various implementations, is sufficiently high to minimize the amount of impact ionization by the primary electron $e_p-$ in the first material $M_1$. As the primary electron $e_p-$ travels through the first material $M_1$, it approaches the first of two oppositely doped first and second layers 65 and 66. The oppositely doped first and second layers 65 and 66 are separated by an intrinsic sub-region 67 of the first material $M_1$ and there exists a localized electric field $E_L$ between them which is elevated in magnitude relative to the "background" electric field E produced by the reverse bias voltage $V_{RB}$. See FIG. 1B, which graphically illustrates the field profile over the APD 10. The first layer 65 is p-doped such that, when the reverse bias voltage $V_{RB}$ is applied, the layer 65 accepts and retains electrons, thereby giving rise to its negative charge, as indicated in FIG. 1C. Conversely, the second layer is n-doped such that, when the reverse bias voltage $V_{RB}$ is applied, the layer 66 donates electrons, thereby rendering the layer 66 positively charged. Accordingly, when the primary electron $e_p-$ enters the intrinsic sub-region 67, it is rapidly accelerated toward the second region 70 of the first period 52A. As shown in FIG. 1D, the kinetic energy of the primary electron $e_p-$ is typically raised to a level such that some impact ionization occurs within the first material $M_1$, before the primary electron $e_p-$ crosses the first region-second region interface $I_{1-2}$. That is, in the example of FIG. 1, the magnitude of the localized electric field E is sufficiently great that the primary electron $e_p-$ has gained a sufficient level of energy to exceed the first impact ionization threshold $T_{i1}$. To minimize the amount of impact ionization in the first material $M_1$, and the associated electron energy loss, various implementations include as an objective positioning the second doped layer 66 as close to the first region-second region interface $I_{1-2}$ as practicable. In this way, the kinetic energy of an electron can be at or near its theoretical highest just prior to traversing the first region-second region interface $I_{1-2}$. Moreover, various implementations include as an objective making the second layer 66 very thin with respect to other layers within the period 52, an objective that was observed in the fabrication of the specific illustrative example described below. The thickness of the sub-region 67 is another parameter subject to optimization for the purposes of minimizing hole impact ionization rate in the first material $M_1$ while maximizing electron kinetic energy just prior to entry into the second material $M_2$.

Upon entering the second region 70, the primary electron $e_p-$ has a predetermined statistical probability of dissipating energy through impact ionization and, thereby, generating additional pairs of first and second oppositely charged charge carriers at a predetermined statistical rate. For purposes of differentiation from primary charge carriers generated in the absorption region 40 through photon-energy absorption, the first and second oppositely charged charge carriers generated through impact ionization are referred to as secondary electrons $e_s-$ and secondary holes $h_s+$. As illustrated qualitatively in the graph of FIG. 1D, the statistical probability of an electron's (either primary $e_p-$ or secondary $e_s-$) impact ionizing at a relatively high rate is highest as the electron e- enters the second region 70 of a particular period 52. This phenomenon follows from the fact that, at least within the second region 70, the kinetic energy of the electron e- is highest as it enters the second material $M_2$. As the electron e- continues traversing the second region 70, its kinetic energy is reduced and the rate at which it impact ionizes is reduced.

The process of electron acceleration and impact ionization is repeated for each primary electron $e_p-$ and each secondary electron $e_s-$ through each subsequent period 52 of the multiplication region 50. As a general observation, the greater the number of periods 52 in the multiplication region 52, the higher the final yield of charge carriers per primary electron $e_p-$.

As explained in the summary, a quantity of charge carriers of the non-preferred type (e.g., holes h+) will impact ionize.

In the illustrative example of FIG. 1A, each secondary hole $h_s+$ of a selected set of holes h+ generated in each second region 70 of each period 52 in the multiplication region 50, whether through impact ionization by primary electrons $e_p-$, secondary electrons $e_s-$ or secondary holes $h_s+$, will have, by virtue of the electric field E, a travel path directed across the first region-second region interface $I_{1-2}$ toward the first side 62 of the first region 60 of at least one period 52. The travel path extends at least partially through each of the first and second crystalline materials $M_1$ and $M_2$ of a particular period 52. For instance, the travel path of a secondary hole $h_s+$ will typically extend only partially through the second material $M_2$ (or first material $M_1$) in which it is generated. Typically, however, only secondary holes $h_s+$ having an opportunity to pass through at least a portion of the intrinsic sub-region 67 of the first region 60 of a period 52 will be accelerated sufficiently by the localized electric field $E_L$ therein to impact ionize in the first material $M_1$. A secondary hole $h_s+$, for instance, generated within the sub-region 67 very near the positively charged second layer 66 by an electron e− on its way into the second region 70 possesses a higher statistical probability of being accelerated by the localized, electric field $E_L$, in the direction opposite the path of the electron e−, sufficiently to impact ionize in the first material 60, than a secondary hole $h_s+$ generated nearer the negatively charged first layer 65. However, a secondary hole $h_s+$ generated in the second region 70, and thus subjected to the force of the localized electric field $E_L$ for the entire thickness of the intrinsic sub-region 67 possesses a still higher statistical probability of impact ionizing in the first material $M_1$.

Although a quantity of holes h+ will impact ionize, it will be appreciated that a hole h+ has a lower statistical probability of dissipating energy through impact ionization within the first material $M_1$ at as high a statistical rate as an electron e− in the second material $M_2$ due to the higher impact ionization threshold $T_{i1}$ of the first material M1. In a simplified illustration intended only to facilitate an understanding of the operative principle of an embodiment, FIG. 2 depicts a periodic multiplication region 50 in which each electron e− that travels the entire length of one period 52 possesses a statistical probability of impact ionizing at a rate three times (3×) that of a hole h+ that travels the length of the same period. This is because, within a period 52, electrons e− possess a large kinetic energy while inside a material of low ionization threshold, while holes h+ possess a large kinetic energy only while inside a material of high ionization material. Although the depiction in FIG. 2 is simplistic, it facilitates comprehension of the general scheme by which electrons e−, as the preferred carriers, are caused to impact ionize at a greater rate than holes h+.

Figure 3A:
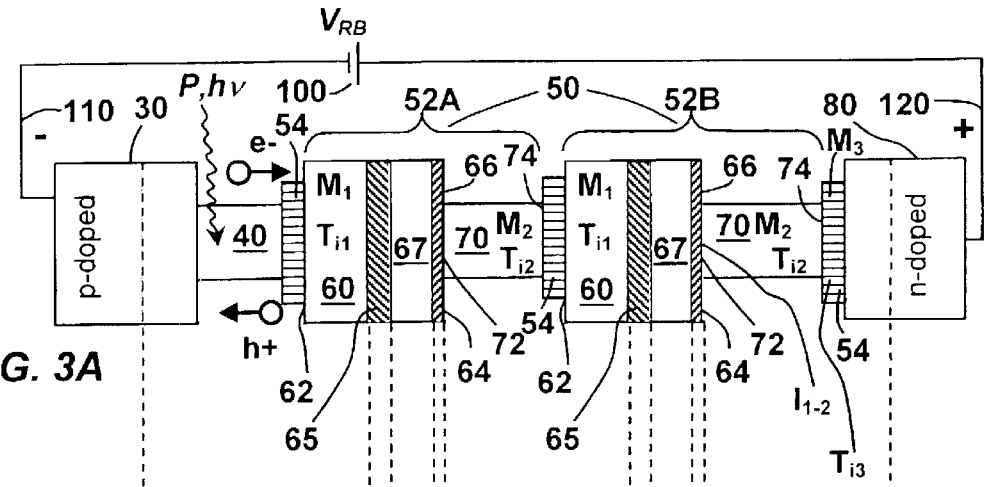
FIG. 3A depicts an embodiment including a hole step-down region between the optical absorption region and a first period of an illustrative two-period multiplication region, between the two periods and between the second period and the diode cathode.
Figure 3B:
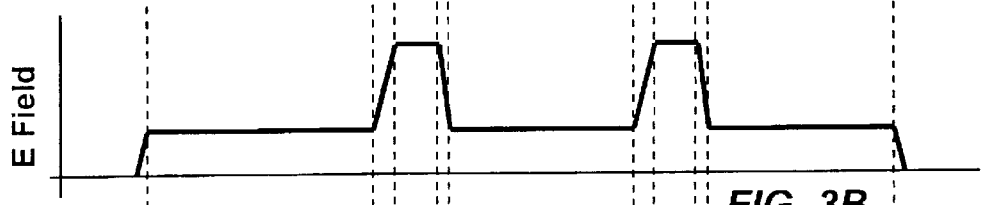
FIG. 3B indicates the electric profile of the APD in FIG. 3A.
Figure 3C:
FIG. 3C indicates the charge present in each of region of a selected set of regions within the APD of FIG. 3A as a result of doping and an applied reverse bias voltage.
Figure 3D:
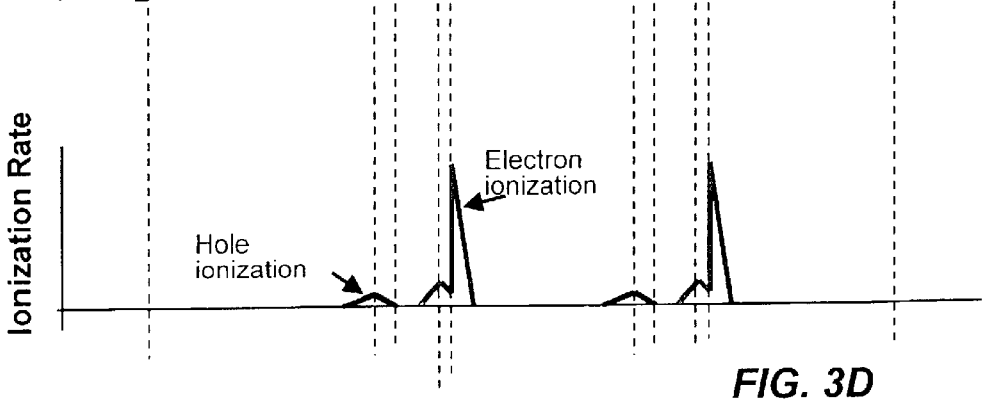
FIG. 3D is a graphical representation of impact ionization rate of each of electrons and holes in each of the two periods of the illustrative multiplication region in FIG. 3A as a function of position within the multiplication region.

Referring to FIGS. 3A through 3D, the structure of an alternative APD 10 is schematically represented. The structure of the illustrative embodiment in FIG. 3A is similar to that of the APD 10 represented in FIG. 1A. However, the APD 10 of FIG. 3A further includes a hole step-down region 54 between each of (i) the optical absorption region 40 and the first period 52A of the multiplication region 50, (ii) the first and second periods 52A and 52B and (iii) the second period 52B of the multiplication region 50 and the diode cathode 120. Although the specific embodiment of FIG. 3A includes a hole step-down region 54 in each of the positions described and depicted, it is to be understood that implementations including a hole step-down region 54 in fewer than all of these positions are within the scope and contemplation of the invention.

An illustrative hole step-down region 54 comprises at least one discrete layer of a third material $M_3$ with an energy gap greater than that of the second material $M_2$ and lower than that of the first material $M_1$ and a third impact ionization threshold $T_{i3}$ greater than that of the second impact ionization threshold $T_{i2}$ and lower than that of the first impact ionization threshold $T_{i1}$. As previously stated, the hole step-down region 54 "breaks up" the energy step encountered by holes h+ traveling from the first region 60 of the second period 52B into the second region 70 of the neighboring first period 52A thereby decreasing the probability of hole-initiated impact ionization. Moreover, electrons e− traveling from the second region 70 of the first period 52A into the first region 60 of the neighboring period 52B are provided with an intermediate energy step that facilitates the "climb" and enhances the overall speed of the device. In versions in which holes h+ are the preferred carriers, it is to be understood that an electron step-down region would serve to perform functions analogous to those performed by the hole step-down region 54 in FIG. 3A.

Another alternative variation, as depicted FIG. 4A, includes a continuously graded transition $T_{CG}$ between the first and second regions 60 and 70 of each of the first and second periods 52A and 52B of an illustrative two-period multiplication region 50. The continuously graded transition $T_{CG}$ exhibits a continuous grade in energy gap and ionization threshold over ranges between the energy gaps and ionization thresholds $T_{i1}$ and $T_{i2}$ exhibited by the first and second materials $M_1$ and $M_2$ of the first and second regions 60 and 70. The graded transition $T_{CG}$ in the embodiment of FIG. 4A replaces the first region-second region interface $I_{1-2}$ in, for example, the version of FIG. 1A. Moreover, wherein it is an objective in connection with various versions, such as that of FIG. 1A, to fabricate a "very thin" second doped layer 66 within the first region 60, in the version of FIG. 4A, the continuously graded transition $T_{CG}$ is a doped region substantially broader than the second doped layer 66 of a version typified by FIG. 1A. A localized electric field $E_L$ exists between the first doped layer 65 and the continuously graded transition $T_{CG}$ and the electric field profile falls off throughout the continuously graded transition $T_{CG}$ as shown in FIG. 4B. Although the continuously graded transition $T_{CG}$ (FIG. 4A) is broader than the second doped layer 66 (FIG. 1A), it is important to keep the continuously graded transition $T_{CG}$ sufficiently thin to minimize impact ionization by hole h+ therein. Referring to FIG. 4D, the rate of impact ionization by electrons e− rises and, in fact, peaks within the continuously graded transition $T_{CG}$ before dropping to a minimum in the second region 70.

FIG. 5A depicts a schematic of an APD 10 having step-graded transitions $T_{SG}$ in place of the continuously graded transitions $T_{CG}$ shown in FIG. 4A. FIGS. 5B through 5D graphically indicate profiles of, respectively, (i) the electric field, (ii) the charge in each region of a selected set of regions as a result of doping and applied reverse bias voltage and (iii) impact ionization rate of holes h+ and electrons e− as a function of position within the multiplication region 50. The version of FIG. 5A is similar in concept to the version of FIG. 4A. However, the continuously graded transition $T_{CG}$ is replaced by at least one discrete layer of a third material $M_3$ with an energy gap greater than that of the second material $M_2$ and lower than that of the first material $M_1$ and a third impact ionization threshold $T_{i3}$ greater than that of the second impact ionization threshold $T_{i2}$ and lower than that of the first impact ionization threshold $T_{i1}$. It will be appreciated that, in versions including a multi-layered step-graded transitions $T_{SG}$, layers closer to, for example the first region 60 will be more similar to the first material $M_1$ in energy gap and ionization threshold than to the second material $M_2$. Conversely, the energy gaps and ionization thresholds of layers closer to the second region 70 will more closely resemble those of the second material M2.

Analogous versions in which holes h+ are the preferred carriers are within the scope and contemplation of the invention. In such versions, certain aspects of the illustrative embodiments depicted throughout the drawings and described throughout the summary and detailed description would be reversed. For instance, positively charged layers or regions described above would be reversed to negative and negative regions and layer would be made positive and first and second regions 60 and 70 of first and second materials $M_1$ and $M_2$ would be reversed, for example, with respect to a diode anode 30 and diode cathode 80. Moreover, materials more conducive to hole-initiated impact ionization would substitute for materials more conducive to electron-initiated impact ionization as appropriate.

Specific Illustrative Example

The following example indicates materials, intended doping rates and intended region and layer thicknesses of an APD 200 fabricated and tested under experimental conditions. It is to be understood that the specification of the following materials and parameters in no way constitutes a set of limitations of the scope of the invention.

Figure 6:
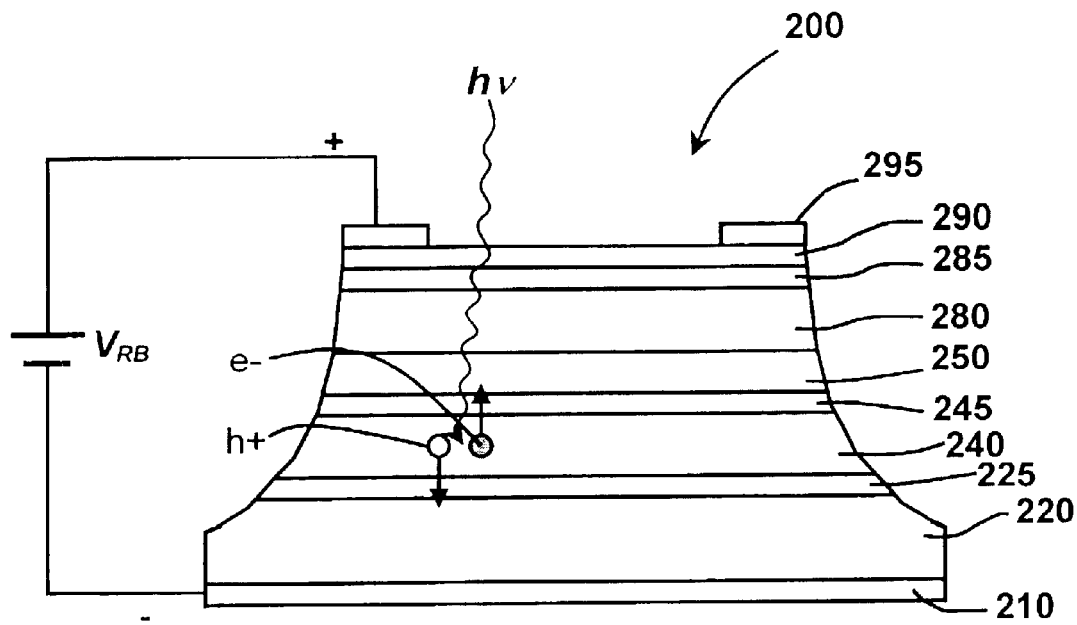
FIG. 6 depicts an example of an avalanche photodiode fabricated in accordance with the principles of the invention.

FIG. 6 is a cross-sectional view illustrating an APD 200 fabricated in a manner calculated to observe as nearly as practicable the parameters (e.g., thicknesses and doping concentrations) indicated below. The APD 200 includes (i) a substrate 220 of p-doped InP; (ii) a depletion stop layer 225 of p-doped InGaAs having a doping concentration of $1.0 \times 10^{18}$ $cm^{-3}$ and a thickness of 0.1 micron; an optical absorption layer 240 of unintentionally doped InGaAs having a thickness of 0.5 micron; a grading layer 245 of unintentionally doped InAlGaAs having a thickness of 0.05 micron; a charge- carrier multiplication 250, a drift layer 280 of unintentionally doped InAlAs 0.8 microns thick; a passivating layer 285 of unintentionally doped InP and thickness of 0.05 microns; and a contacting layer 290 of n-doped InAlAs having a doping concentration of $1 \times 10^{18}$ $cm^{-3}$ and a thickness of 0.2 micron. A ring-shaped metal electrode 295 on a top surface of the contacting layer 290 provides a conductive contact for placement in electrically conductive engagement with the negative-charge-attracting anode of an external energy source. Another metal electrode 210 is provided on a surface of the substrate 220 opposite the depletion stop layer 225.

Figure 6A:
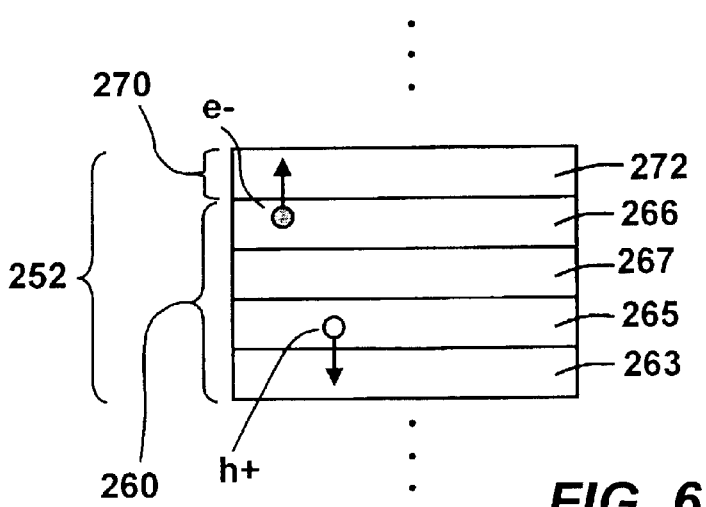
FIG. 6A is a schematic detail of a single period of the multiplication region of the avalanche photodiode of FIG. 6.

As modeled and fabricated, the multiplication layer 250 includes six periods 252 of a set of layers illustrated in the cross-sectional detail of a single period shown in FIG. 6A. Each period 252 includes a first region 260 and a second region 270. The first region includes a hole relaxation layer 263 of unintentionally doped InAlAs 0.02 micron thick. The hole relaxation layer 263 corresponds to the intrinsic portion between the first side 62 and the first doped layer 65 of the first region 60 in the more general illustration of FIG. 1A. The first region 260 further includes an electric field build up layer 265 of p-doped InAlAs having a thickness of 0.04 micron and a doping concentration of $1 \times 10^{18}$ $cm^{-3}$; a carrier acceleration layer 267 of unintentionally doped InAlAs with a thickness of 0.03 microns and an electric field reduction layer 266 of n-doped InAlAs with a $8 \times 10^{18}$ $cm^{-3}$ doping concentration and a thickness of 0.005 micron. The electric field build up layer 265, the carrier acceleration layer 266 and the electric field reduction layer 266 correspond, respectively, to the first doped layer 65, the intrinsic sub-region 67 and the second doped layer 66 in the first region 60 of a period 52 shown in FIG. 1A. It should be noted that, while the term "carrier acceleration layer" is applicable to either an electron e– or a hole h+, the terms "electric field build up layer 265" and "electric field reduction layer 266" are taken from the perspective of an electron e– since these layers 265 and 266 serve the opposite functions with respect to a hole h+ moving in the opposite direction. The second region 270 includes an electron impact ionization layer 272 of unintentionally doped InGaAs with a thickness of 0.04 micron corresponding to the second region 70 of a period 52 in FIG. 1A.

During fabrication, the depletion stop layer 225; the absorption layer 240; the grading layer 245; the multiplication layer 250 including, in this particular case, six periods 252 of layers 263 through 272; the drift layer 280; the passivating layer 285 and the contacting layer 290 are successively grown on the substrate 220 by use of, for example, molecular beam epitaxy (MBE). As practitioners of ordinary skill in the art will appreciate, other techniques may be employed in fabricating the APD 200 including, for instance, vapor phase epitaxy (VPE), metal-organic chemical vapor deposition (MOCVD) and wafer bonding.

In the APD 200, electrons e– and holes h+ are generated in the optical absorption layer 240 by incident photons. The holes h+ are swept by the applied electric field through the absorption layer 240 and collected in the depletion stop layer 225. Contemporaneously, the electrons e– are swept into the multiplication layer 250. The electrons e– are accelerated in the carrier acceleration layer 267 and then injected into the impact ionization layer 272 as "hot" carriers since they have come from a layer of high electric field (i.e., the carrier acceleration layer 267) and the electric field reduction layer 267 is, relatively, very thin. While in the impact ionization layer 272, these electrons e– release their energy through collisions with the crystalline lattice and cause secondary electron-hole pairs to be generated. The primary and secondary electrons e– are then swept out of the impact ionization layer 272 of the first period and into the next period 252 where, in a repeat of the carrier multiplication process, they are caused to initiate further impact ionizations. After traveling through the last period 252, electrons e– are swept out of the multiplication layer 272, through the drift and passivating layers 280 and 285 and collected by the contacting layer 290.

A secondary hole h+, on the other hand, generated in an impact ionization layer 272 is swept into, and accelerated through, a carrier acceleration layer 267 and into a hole relaxation layer 263 where it loses most of its energy without impact ionizing. The hole h+ is next swept into an impact ionization layer 272 of a subsequent period 252 (if applicable) where it does not have sufficient energy to initiate impact ionization because it has been injected from a region of relatively low electric field and high impact ionization threshold. In this manner, holes h+ traveling through a multiplication layer 250 initiate a relatively small number of impact ionizations. Once the holes h+ have departed the multiplication layer 250 they are swept through the grading layer 245 and absorber layer 240 and collected in the depletion stop layer 225. In this manner, the effective electron ionization rate is greatly enhanced over that of holes. Consequently the APD 200 exhibits highly desirable noise and gain bandwidth product characteristics.

Although, in this example, InP was used as a substrate material and InGaAs lattice matched to InP as absorber material, alternative substrate materials may be used with alternative absorber materials suitable for the wavelengths of interest. Moreover, alternative materials having substantially differing impact ionization rates may be selected for use in the multiplication layer 250 in order to enhance the impact ionization rate of one carrier type over the opposite type.

The foregoing is considered to be illustrative of the principles of the invention. Furthermore, since modifications and changes to various aspects and implementations will occur to those skilled in the art without departing from the scope and spirit of the invention, it is to be understood that the foregoing does not limit the invention as expressed in the appended claims to the exact construction, implementations and versions shown and described.

What is claimed is:

1. An avalanche photodiode charge-carrier multiplication region adapted to facilitate (a) the generation, through impact ionization, of charge-carrier pairs, each charge-carrier pair including first and second oppositely charged charge carrier types, and (b) the movement of charge carriers of the first type in a first direction and of charge carriers of the second type in a second direction anti-parallel to the first direction, wherein the impact ionization by one of the first and second charge carrier types is preferred over impact ionization by the opposite charge carrier type and the charge-carrier multiplication region comprises:

at least one period of lattice structure comprising a first crystalline region having first and second sides and being fabricated from a first material having a first impact ionization threshold and a second crystalline region having first and second ends and joined, at the first end, to the second side of the first crystalline region at a first region-second region interface, the second crystalline region being fabricated from a second material having a second impact ionization threshold lower than the first impact ionization threshold, the first crystalline region including, at least in the presence of an externally applied electric field, first and second oppositely charged layers separated by an intrinsic sub-region of the first crystalline region such that a localized electric field, is present between the first and second charged layers, the first and second charged layers being arranged such that (i) each charge carrier of a set of charge carriers of the preferred type having a travel path directed toward the second end of the second crystalline region, and extending through the first region-second region interface, encounters a charged layer of the same charge prior to encountering the charged layer of the opposite charge, such that the preferred charge type is accelerated by the localized electric field prior to passing through the first region-second region interface and entering the second crystalline region where, due to the lower impact ionization threshold of the second crystalline material and the increased kinetic energy of the accelerated preferred charge carrier, the preferred charge carrier has a predetermined statistical probability of dissipating energy through impact ionization and generating additional pairs of first and second oppositely charged charge carrier types at a predetermined statistical rate and such that (ii) each charge carrier of a set of charge carriers of the non-preferred type having a travel path directed toward the first side of the first crystalline region, and extending through the first region-second region interface, crosses the second region-first region interface prior to being accelerated by the electric field between the first and second charged layers but, due to higher impact ionization threshold of the first material, has a lower statistical probability of dissipating energy through impact ionization within the first material at as high a statistical rate as does a charge carrier of the preferred type in the second material.

2. The multiplication region of claim 1 wherein the second charged layer is positioned as close to the first region-second region interface a practicable.

3. The multiplication region of claim 1 wherein the second charged layer of each period is thin relative to other layers within each period.

4. The multiplication region of claim 1 wherein the preferred charge carrier type is an electron and the non-preferred charge carrier type is a hole and wherein the first charged layer is positively doped and the second charged layer is negatively doped such that, when a reverse bias voltage is applied across the multiplication region, the first charged layer assumes a negative charge and the second charged layer assumes a positive charge.

5. The multiplication region of claim 4 wherein the second charged layer within each period is positioned as close to the first region-second region interface as practicable.

6. The multiplication region of claim 5 wherein the second charged layer of each period is thin relative to other layers within each period.

7. The multiplication region of claim 4 wherein the second charged layer within each period is positioned as close to the first region-second region interface as practicable.

8. The multiplication region of claim 4 wherein
(i) the first region is fabricated from a material selected from a set of materials including (a) InAlAs, (b) AlGaAs (c) InP, (d) InAlGaAs and (e) InGaAsP, and
(ii) the second region is fabricated from a material selected from a set of materials including (a) InGaAs (b) InAlGaAs (c) GaAs, (d) InGaAsP and Si.

9. The multiplication region of claim 1 wherein
(i) the first region is fabricated from a material selected from a set of materials including (a) InAlAs, (b) AlGaAs (c) InP, (d) InAlGaAs and (e) InGaAsP, and
(ii) the second region is fabricated from a material selected from a set of materials including (a) InGaAs (b) InAlGaAs (c) GaAs, (d) InGaAsP and Si.

10. The multiplication region of claim 1 wherein the preferred charge carrier type is an electron and the non-preferred charge carrier type is a hole and wherein the first charged layer is negatively doped and the second charged layer is positively doped such that, when a reverse bias voltage is applied across the multiplication region, the first charged layer assumes a positive charge and the second charged layer assumes a negative charge.

11. The multiplication region of claim 10 wherein the second charged layer within each period is positioned as close to the first region-second region interface as practicable.

12. The multiplication region of claim 11 wherein the second charged layer of each period is thin relative to other layers within each period.

13. The multiplication region of claim 10 wherein the second charged layer within each period is positioned as close to the first region-second region interface as practicable.

14. The multiplication region of claim 10 wherein
(iii) the first region is fabricated from a material selected from a set of materials including (a) InAlAs, (b) AlGaAs (c) InP, (d) InAlGaAs and (e) InGaAsP, and (iv) the second region is fabricated from a material selected from a set of materials including (a) InGaAs (b) InAlGaAs (c) GaAs, (d) InGaAsP and Si.

15. An avalanche photodiode comprising:

a p-doped diode anode adapted for reverse-bias, electrically conductive engagement with the positive-charge-attracting cathode of an external energy source;

an optical absorption region wherein photons energy is absorbed in the generation of electron-hole pairs;

a charge-carrier multiplication region adapted to facilitate the generation, through impact ionization, of electron-hole pairs, each electron hole pair including an electron and a hole, wherein impact ionization by electrons is preferred over impact ionization by holes; and an n-doped diode cathode adapted for reverse-bias, electrically conductive engagement with the negative-charge-attracting anode of the external energy source, wherein the optical absorption region and the charge-carrier multiplication region are positioned between the diode anode and the diode cathode, with the optical absorption region being more proximate the diode anode than is the multiplication region, and the charge-carrier multiplication region comprises:

at least one period of lattice structure comprising a first crystalline region having first and second sides and being fabricated from a first material having a first impact ionization threshold and a second crystalline region having first and second ends and joined, at the first end, to the second side of the first crystalline region at a first region-second region interface, the second crystalline region being fabricated from a second material having a second impact ionization threshold lower than the first impact ionization threshold, the first crystalline region including a first, p-doped layer and a second, n-doped layer separated by an intrinsic sub-region of the first crystalline region such that, when a reverse-bias voltage is applied across the avalanche photodiode, the first, p-doped layer assumes a negative charge, the second, n-doped layer assumes a positive charge and a localized electric field is present between the first and second charged layers, the first and second charged layers being arranged such that (i) each electron of a set of electrons having a travel path directed toward the second end of the second crystalline region, and extending through the first region-second region interface, encounters the first, negatively charged layer prior to encountering the second, positively charged layer, such that the electron is accelerated by the localized electric field prior to passing through the first region-second region interface and entering the second crystalline region where, due to the lower impact ionization threshold of the second crystalline material and the increased kinetic energy of the electron, the electron has a predetermined statistical probability of dissipating energy through impact ionization and generating additional electron-hole pairs at a predetermined statistical rate and such that (ii) each hole of a set of holes having a travel path directed toward the first side of the first crystalline region, and extending through the first region-second region interface, crosses the second region-first region interface prior to being accelerated by the electric field between the first and second charged layers but, due to the higher impact ionization threshold of the first material, has a lower statistical probability of dissipating energy through impact ionization within the first material at as high a statistical rate as does an electron in the second material.

16. The avalanche photodiode of claim 15 wherein the second charged layer is positioned as close to the first region-second region interface a practicable.

17. The avalanche photodiode of claim 15 wherein the second charged layer of each period is thin relative to other layers within each period.

18. The avalanche photodiode of claim 15 wherein (i) the first region is fabricated from a material selected from a set of materials including (a) InAlAs, (b) AlGaAs (c) InP, (d) InAlGaAs and (e) InGaAsP, and (ii) the second region is fabricated from a material selected from a set of materials including (a) InGaAs (b) InAlGaAs (c) GaAs, (d) InGaAsP and Si.

19. The avalanche photodiode of claim 15 wherein the multiplication region comprises at least two periods including a period closest to the absorption region and a period closest to the diode cathode, the first region of each period is more proximate the absorption region than the second region of the same period and the avalanche photodiode further comprises, between at least one of (i) the optical absorption region and the first region of the period of the multiplication region closest the optical absorption region, (ii) between a first and second period and (iii) the diode cathode and the second region of the period closest to the diode cathode, a hole step-down region fabricated from a third material having an energy gap greater than that of the second material and lower than that of the first material and a third impact ionization threshold greater than that of the second impact ionization threshold and lower than that of the first impact ionization threshold.

20. An avalanche photodiode comprising:

a p-doped diode anode adapted for reverse-bias, electrically conductive engagement with the positive-charge-attracting cathode of an external energy source;

an optical absorption region wherein photons energy is absorbed in the generation of electron-hole pairs;

a charge-carrier multiplication region adapted to facilitate the generation, through impact ionization, of electron-hole pairs, each electron hole pair including an electron and a hole, wherein impact ionization by holes is preferred over impact ionization by electrons; and an n-doped diode cathode adapted for reverse-bias, electrically conductive engagement with the negative-charge-attracting anode of the external energy source, wherein the optical absorption region and the charge-carrier multiplication region are positioned between the diode cathode and the diode anode, with the optical absorption region being more proximate the diode cathode than is the multiplication region, and the charge-carrier multiplication region comprises:

at least one period of lattice structure comprising a first crystalline region having first and second sides and being fabricated from a first material having a first impact ionization threshold and a second crystalline region having first and second ends and joined, at the first end, to the second side of the first crystalline region at a first region-second region interface, the second crystalline region being fabricated from a second material having a second impact ionization threshold lower than the first impact ionization threshold, the first crystalline region including a first, n-doped layer and a second, p-doped layer separated by an intrinsic sub-region of the first crystalline region such that, when a reverse-bias voltage is applied across the avalanche photodiode, the first, n-doped layer assumes a positive charge, the second, p-doped layer assumes a negative charge and a localized electric field is present between the first and second charged layers, the first and second charged layers being arranged such that (i) each hole of a set of holes having a travel path directed toward the second end of the second crystalline region, and extending through the first region-second region interface, encounters the first, positively charged layer prior to encountering the second, negatively charged layer, such that the hole is accelerated by the localized electric field prior to passing through the first region-second region interface and entering the second crystalline region where, due to the lower impact ionization threshold of the second crystalline material and the increased kinetic energy of the hole, the hole has a predetermined statistical probability of dissipating energy through impact ionization and generating additional electron-hole pairs at a predetermined statistical rate and such that (ii) each electron of a set of electrons having a travel path directed toward the first side of the first crystalline region, and extending through the first region-second region interface, crosses the second region-first region interface prior to being accelerated by the electric field between the first and second charged layers but, due to the higher impact ionization threshold of the first material, has a lower statistical probability of dissipating energy through impact ionization within the first material at as high a statistical rate as does a hole in the second material.

21. The avalanche photodiode of claim 20 wherein the second charged layer is positioned as close to the first region-second region interface a practicable.

22. The avalanche photodiode of claim 21 wherein the second charged layer of each period is thin relative to other layers within each period.

23. The avalanche photodiode of claim 20 wherein
(iii) the first region is fabricated from a material selected from a set of materials including (a) InAlAs, (b) AIGaAs (c) InP, (d) InAlGaAs and (e) InGaAsP, and
(iv) the second region is fabricated from a material selected from a set of materials including (a) InGaAs (b) InAlGaAs (c) GaAs, (d) InGaAsP and Si.

24. The avalanche photodiode of claim 20 wherein the multiplication region comprises at least two periods including a period closest to the absorption region and a period closest to the diode anode, the first region of each period is more proximate the absorption region than the second region of the same period and the avalanche photodiode further comprises, between at least one of (i) the optical absorption region and the first region of the period of the multiplication region closest the optical absorption region, (ii) between a first and second period and (iii) the diode anode and the second region of the period closest to the diode anode, an electron step-down region fabricated from a third material having an energy gap greater than that of the second material and lower than that of the first material and a third impact ionization threshold greater than that of the second impact ionization threshold and lower than that of the first impact ionization threshold.

25. An avalanche photodiode charge-carrier multiplication region adapted to facilitate the generation, through impact ionization, of electron-hole pairs, each electron-hole pair including an electron and a hole, and the movement of electrons in a first direction and of holes in a second direction anti-parallel to the first direction, wherein impact ionization by electrons is preferred over impact ionization by holes and the charge-carrier multiplication region comprises:

at least one period of lattice structure comprising a first crystalline region having first and second sides and being fabricated from a first material having a first impact ionization threshold and a second crystalline region having first and second ends and joined, at the first end, to the second side of the first crystalline region through a transition, the second crystalline region being fabricated from a second material having a second impact ionization threshold lower than the first impact ionization threshold and the transition being fabricated from material exhibiting one of (i) a range of ionization thresholds lower than the first ionization threshold and greater than the second ionization threshold and (ii) a single ionization threshold lower than the first ionization threshold and greater than the second ionization threshold, the first crystalline region and the transition respectively including, at least in the presence of an externally applied electric field, a first, negatively charged layer and a second, positively charged layer separated by an intrinsic sub-region of the first crystalline region such that a localized electric field is present between the first and second charged layers, the first and second charged layers being arranged such that (a) each electron of a set of electrons having a travel path directed toward the second end of the second crystalline region, and extending through the transition, encounters the first, negatively charged layer prior to encountering the second, positively charged layer such that the electron is accelerated by the localized electric field prior to passing through the transition and into the second crystalline region where, due to the lower impact ionization thresholds of the transition and the second crystalline material, and the increased kinetic energy of the electron, the electron has a predetermined statistical probability of dissipating energy through impact ionization and generating additional electron-hole pairs at a predetermined statistical rate and such that (ii) each hole of a set of holes having a travel path directed toward the first side of the first crystalline region, and extending through the transition, enters the transition prior to being accelerated by the electric field between the first and second charged layers but, due to the higher impact ionization thresholds of the transition and first material, has a lower statistical probability of dissipating energy through impact ionization within the transition and the first material at as high a statistical rate as does an electron in the transition and the second material.

26. The multiplication region of claim 25 wherein the transition is step-graded and comprises at least one discrete layer having an impact ionization threshold greater than that of the second impact ionization threshold and lower than that of the first impact ionization threshold.

27. The multiplication region of claim 25 wherein the transition is continuously graded so as to exhibit a range of impact ionization thresholds between the first and second impact ionization thresholds.

28. An avalanche photodiode charge-carrier multiplication region adapted to facilitate the generation, through impact ionization, of electron-hole pairs, each electron-hole pair including an electron and a hole, and the movement of electrons in a first direction and of holes in a second direction anti-parallel to the first direction, wherein impact ionization by holes is preferred over impact ionization by electrons and the charge-carrier multiplication region comprises:

at least one period of lattice structure comprising a first crystalline region having first and second sides and being fabricated from a first material having a first impact ionization threshold and a second crystalline region having first and second ends and joined, at the first end, to the second side of the first crystalline region through a transition, the second crystalline region being fabricated from a second material having a second impact ionization threshold lower than the first impact ionization threshold and the transition being fabricated from material exhibiting one of (i) a range of ionization thresholds lower than the first ionization threshold and greater than the second ionization threshold and (ii) a single ionization threshold lower than the first ionization threshold and greater than the second ionization threshold, the first crystalline region and the transition respectively including, at least in the presence of an externally applied electric field, a first, positively charged layer and a second, negatively charged layer separated by an intrinsic sub-region of the first crystalline region such that a localized electric field is present between the first and second charged layers, the first and second charged layers being arranged such that (a) each hole of a set of holes having a travel path directed toward the second end of the second crystalline region, and extending through the transition, encounters the first, positively charged layer prior to encountering the second, negatively charged layer such that the hole is accelerated by the localized electric field prior to passing through the transition and into the second crystalline region where, due to the lower impact ionization thresholds of the transition and the second crystalline material, and the increased kinetic energy of the hole, the hole has a predetermined statistical probability of dissipating energy through impact ionization and generating additional electron-hole pairs at a predetermined statistical rate and such that (ii) each electron of a set of electrons having a travel path directed toward the first side of the first crystalline region, and extending through the transition, enters the transition prior to being accelerated by the electric field between the first and second charged layers but, due to the higher impact ionization thresholds of the transition and first material, has a lower statistical probability of dissipating energy through impact ionization within the transition and the first material at as high a statistical rate as does a hole in the transition and the second material.

29. The multiplication region of claim 28 wherein the transition is step-graded and comprises at least one discrete layer having an impact ionization threshold greater than that of the second impact ionization threshold and lower than that of the first impact ionization threshold.

30. The multiplication region of claim 28 wherein the transition is continuously graded so as to exhibit a range of impact ionization thresholds between the first and second impact ionization thresholds.

* * * * *